United States Patent [19]
Kato et al.

[11] Patent Number: 4,956,249
[45] Date of Patent: Sep. 11, 1990

[54] MASK STRUCTURE FOR LITHOGRAPHY

[75] Inventors: Hideo Kato; Hirohumi Shibata, both of Yokohama; Keiko Matsushita, Tokyo; Osamu Takamatsu, Yokohama, all of Japan

[73] Assignee: Canon Kabushiki Kaisha, Tokyo, Japan

[21] Appl. No.: 398,309

[22] Filed: Aug. 25, 1989

Related U.S. Application Data

[63] Continuation of Ser. No. 910,309, Sep. 22, 1986, abandoned, which is a continuation of Ser. No. 652,190, Sep. 19, 1984, abandoned.

[30] Foreign Application Priority Data

Sep. 26, 1983 [JP] Japan .................. 58-177285
Sep. 26, 1983 [JP] Japan .................. 58-177286

[51] Int. Cl.$^5$ ............................................. G03F 1/00
[52] U.S. Cl. ............................... 430/5; 430/967; 428/427; 428/428; 378/35
[58] Field of Search ................ 430/5, 321, 966, 967; 428/65, 66, 427, 428; 378/34, 35

[56] References Cited

U.S. PATENT DOCUMENTS

| | | | |
|---|---|---|---|
| 4,037,111 | 7/1977 | Coquin et al. | 378/35 |
| 4,111,698 | 9/1978 | Sato | 427/240 X |
| 4,171,489 | 10/1979 | Adams et al. | 378/35 |
| 4,579,616 | 4/1986 | Windischmann et al. | 156/160 |
| 4,677,042 | 6/1987 | Kato et al. | 430/5 |

Primary Examiner—Jose Dees
Attorney, Agent, or Firm—Fitzpatrick, Cella, Harper & Scinto

[57] ABSTRACT

A mask structure for lithography comprising an annular base plate supporting a peripheral portion of a masking-material-holding film provided on a surface thereof with a desired pattern of the masking material is provided which is characterized in that the masking-material-holding film and the base plate are bonded together at an outer peripheral surface, which is connected smoothly or with an appropriate angle to the topmost flat end surface of the base plate and is at a lower level than the topmost flat end surface of the base plate, or at a surface contiguous to the outer peripheral surface.

6 Claims, 3 Drawing Sheets

MASK STRUCTURE FOR LITHOGRAPHY

This application is a continuation of application Ser. No. 06/910,309 filed Sept. 22, 1986, which application is a continuation of application Ser. No. 06/652,190 filed Sept. 19, 1984, both now abandoned.

BACKGROUND OF THE INVENTION

1. Field of the Invention

The present invention relates to an article of a mask structure for use in lithography.

2. Description of the Prior Art

A process for manufacturing various products by partial surface modification of workpieces using a lithographic technique is widely utilized in industries, particularly in the field of electronic industry. This process enables a mass-production of products having the same modification pattern on the surface. The surface modification of workpieces can be carried out by irradiation with various sorts of energy, where masks provided locally an irradiation-energy-intercepting material are used to form patterns. The mask hitherto used, when the irradiation energy is visible light, comprises a transparent substrate formed of glass, quartz, or the like which is coated with a pattern of black paint or laminated with a pattern of metal foil or the like opaque to visible light.

In recent years, X-rays and further corpuscular beams such as ion beams have come into use for irradiation with growing needs for the formation of finer patterns and for shorter lithographic processing time. The energy of these beams is absorbed for the most part by the glass or quartz plate which is used in the above-mentioned mask for screening visible light. Consequently, it is undesirable, when using these sorts of irradiation energy, to use a glass or quartz plate for the mask. Thus, the mask used for the lithography wherein X-rays or corpuscular beams are employed for irradiation comprises (1) a film transparent to these beams which comprises an inorganic film such as silicon nitride, boron nitride and silicon oxide films an organic film, such as polyimide, polyamide and polyester films, or a composite film of these materials and (2) an overlying pattern of a metal such as gold, platinum, nickel, palladium, rhodium and indium, opaque to these beams. This type of mask does not have a shape retaining ability by itself and is hence supported by a suitable base. FIG. 1 shows a cross-sectional view of a typical example of this type of mask structure used up to now. This mask structure is constructed by bonding the peripheral portion of a masking-material holding film 2 (hereinafter referred simply to as a holding film) transparent to irradiation energy onto one side (the upper surface in respect to FIG. 1) of an annular base plate 3 with an adhesive 4, the holding film 2 being provided with a desired pattern of masking material 1, which can absorb irradiation energy, on the surface. FIG. 2 is a plan view of the annular base plate 3.

However, the above mask structure according to the prior art has difficulties in securing the flatness of the holding film 2 since the following defects may result depending upon the way of applying the adhesive 4: the thickness of the adhesive layer 4 may be uneven, the adhesive 4 may flow out of the perimeter of the holding film 2, or peripheral parts of the holding film 2 may peel off on trimming the perimeter. These defects tend to cause inaccuracy in lithography.

SUMMARY OF THE INVENTION

An object of the invention is to provide an article of a mask structure for lithography constructed by bonding a masking-material-holding film onto a base plate, wherein the flatness of the holding film is improved.

According to one aspect of the present invention, there is provided an article of a mask structure for lithography comprising an annular base plate supporting a peripheral portion of a masking-material-holding film provided on a surface thereof with a desired pattern of the masking material, which is characterized in that the masking-material-holding film and the base plate are bonded together at an outer peripheral surface which is not coplanar and is smoothly connected to the topmost flat end surface of the base plate and is at a lower level than the topmost flat end non-coplanar surface of the base plate or at a surface contiguous to the outer peripheral surface.

According to another aspect of the invention, there is provided an article of a mask structure for lithography comprising an annular base plate supporting a peripheral portion of a masking-material-holding film provided on a surface thereof with a desired pattern of the masking material, which is characterized in that the masking-material holding film and the base plate are bonded together at an outer non-coplanar peripheral surface at a lower level than the topmost flat end surface of the base plate at an appropriate angle therewith, or at a surface contiguous to the outer peripheral surface.

DETAILED DESCRIPTION OF PREFERRED EMBODIMENTS

Figure 1:
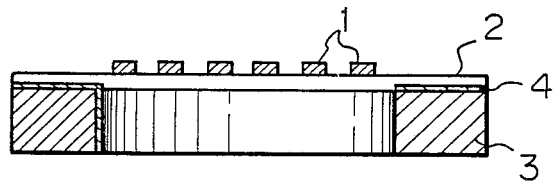
FIG. 1 illustrates a cross-sectional view of a mask structure according to the prior art.
Figure 2:
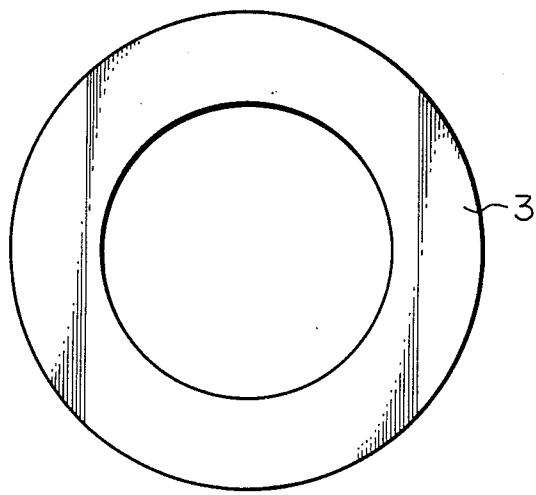
FIG. 2 illustrates a plan view of the base plate of the mask structure according to the prior art.
Figure 3:
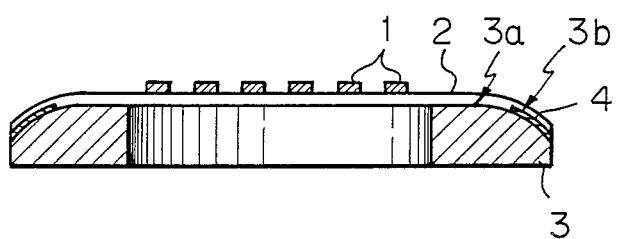
FIGS. 3, 5 and 7 are cross-sectional views of embodiments of the mask structure according to the invention.
Figure 4:
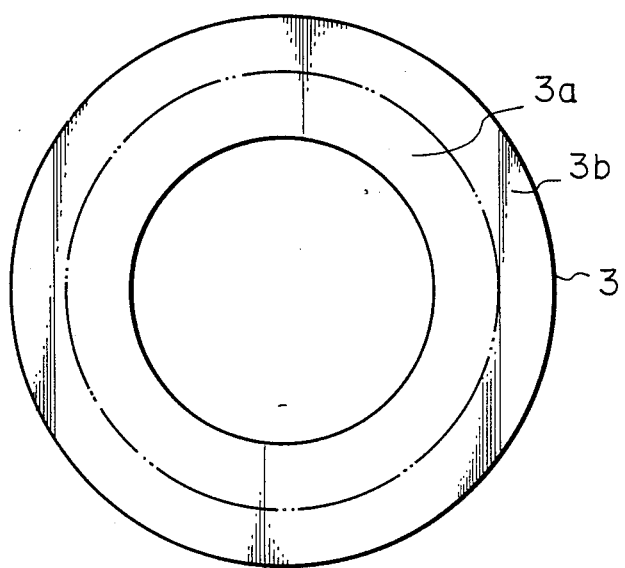
FIGS. 4 and 6 are plan views of the base plates of the embodiments shown in FIGS. 3, 5, respectively.

FIG. 3 illustrates a cross-sectional view of the first embodiment of the mask structure according to the invention. A masking material 1 having a desired pattern is laid upon a surface of a holding film 2. The masking material 1 is formed of a thin film about $0.7\mu$ thick of, for example, gold, platinum, nickel, palladium, rhodium, or indium. The holding film 2 is formed of an inorganic material, for example, silicon nitride, boron nitride, or silicon oxide, or an organic material, for example, polyimide, polyamide, or polyester, to a thickness of, e.g. $2-12\mu$. The holding film 2 is bonded at the peripheral portion of the surface onto an annular base plate 3 through an adhesive 4. FIG. 4 shows a plan view of the base plate 3. The adhesive 4 is applied not on the top flat end surface 3a of the base plate 3 but only on the outer curved annular surface 3b contiguous to the surface 3a. The base plate 3 is formed of, for example, silicon, glass, quartz, phosphor bronze, brass, nickel, or stainless steel. For the adhesive 4, any type may be used, for example, solvent type, heat curable type, or photocurable type, suitably selected from epoxy series, rubber series, and some other series adhesives.

Figure 5:
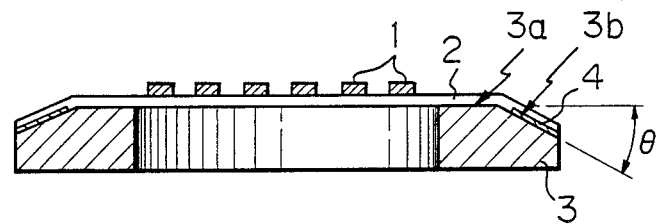

FIG. 5 illustrates a cross-sectional view of the second embodiment of the mask structure according to the invention. In FIG. 5, the same numerals as in FIGS. 3 and 4 are used for the similar meaning.

Figure 6:
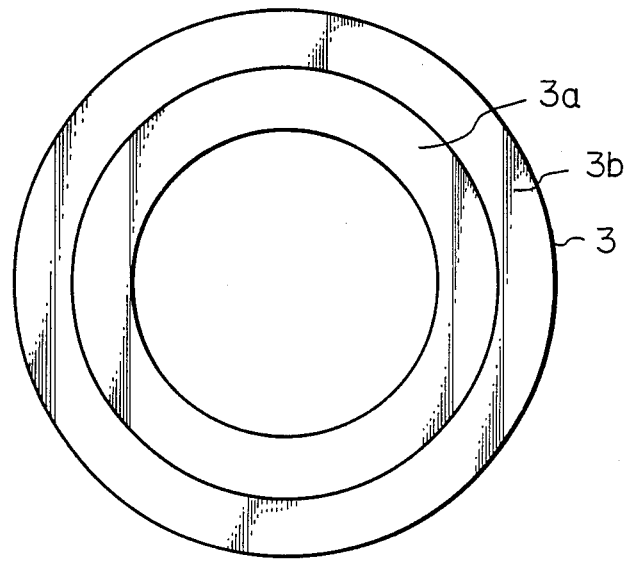

Also in this mask structure, a masking material 1 having a desired pattern is laid upon a surface of holding film 2, which is bonded at the peripheral portion of the surface onto an annular base plate 3 through an adhesive 4. FIG. 6 illustrates a plan view of the base plate 3. The adhesive 4 is applied not on the top flat end surface 3a of the base plate 3 but on the outer slanting annular surface 3b meeting the surface 3a at an angle $\theta$. The angle $\theta$ is not particularly limited provided that it exceeds 0°, but is usually 15–30°.

Figure 7:
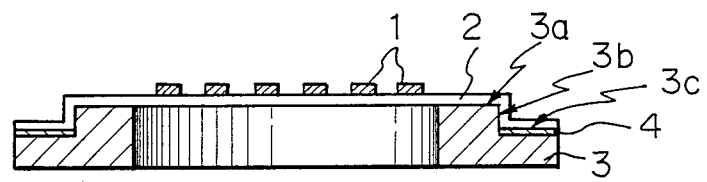

FIG. 7 is a cross-sectional view of the third embodiment of the mask structure according to the invention. This case corresponds to the one where the angle $\theta$ is 90° and additionally the third area 3c serves as the surface on which the adhesive 4 is applied.

In the above embodiments, marginal parts of the holding film 2 that protrude out of the perimeter of the base plate 3 depending upon the configuration thereof may be previously cut off.

According to the mask structure of the invention described hereinbefore, a satisfactory flatness of the masking-material-holding surface can be secured without being affected by the application of the adhesive 4 or by the cutoff of peripheral parts of the holding film 2 since the holding film 2 and the base plate 3 are bonded together at a surface other than the plain including the masking-material-holding surface of the holding film 2. Moreover, in the first embodiment, the holding film 2 is bonded to the base plates 3 at the outer annular area thereof which is smoothly connected to the top flat end surface area of the base plate 3 and is curved downward, and therefore an external force is distributed evenly on the masking-material-holding flat plane of the holding film 2, thus improving further the flatness of said plane.

What we claim is:

1. A mask structure for lithography comprising:
    (a) a base plate having a top flat end surface whose peripheral edge is non-planar so as to define a bonding surface; and
    (b) a masking-material-holding film spanning the top flat end surface and bonded only to the non-planar peripheral edge that defines the bonding surface, wherein said masking-material-holding film is formed from at least one material selected from the group consisting of silicon nitride, boron nitride and silicon oxide.
2. A mask structure for lithography comprising:
    (a) a base plate having a top flat end surface whose peripheral edge is non-planar so as to define a bonding surface; and
    (b) a masking-material-holding film spanning the top flat end surface and bonded only to the non-planar peripheral edge that defines the bonding surface, wherein said masking-material-holding film comprises an organic material.
3. A mask structure for lithography according to claim 2, wherein said organic material is at least one selected from the group consisting of polyimide, polyamide and polyester.
4. A mask structure for lithography comprising:
    (a) a base plate having a top flat end surface and a bonding surface located below the top flat end surface; and
    (b) a masking-material-holding film spanning the top flat end surface and bonded only to the bonding surface, wherein said masking-material-holding film is formed from at least one material selected from the group consisting of silicon nitride, boron nitride and silicon oxide.
5. A mask structure for lithography comprising:
    (a) a base plate having a top flat end surface and a bonding surface located below the top flat end surface; and
    (b) a masking-material-holding film spanning the top flat end surface and bonded only to the bonding surface, wherein said masking-material-holding film comprises an organic material.
6. A mask structure for lithography according to claim 5, wherein said organic material is at least one selected from the group consisting of polyimide, polyamide and polyester.

* * * * *

UNITED STATES PATENT AND TRADEMARK OFFICE
CERTIFICATE OF CORRECTION

PATENT NO. : 4,956,249

DATED : September 11, 1990

INVENTOR(S) : Hideo Kato et al

It is certified that error appears in the above-identified patent and that said Letters Patent is hereby corrected as shown below:

COLUMN 1

Line 22, "locally an" should read --locally with an--; and

Line 42, "films an" should read --films, an--.

COLUMN 3

Line 33, "plain" should read --plane--; and
Line 37, "base plates 3" should read --base plate 3--.

Signed and Sealed this

Twenty-first Day of April, 1992

Attest:

HARRY F. MANBECK, JR.

*Attesting Officer*  *Commissioner of Patents and Trademarks*